Dec. 10, 1957 J. E. LINDSAY 2,816,230

BLOCKING OSCILLATOR CIRCUIT

Filed April 13, 1955

INVENTOR.
James E. Lindsay
BY

ATTORNEY.

United States Patent Office 2,816,230

Patented Dec. 10, 1957

2,816,230

BLOCKING OSCILLATOR CIRCUIT

James E. Lindsay, Moorestown, N. J., assignor to Radio Corporation of America, a corporation of Delaware Application April 13, 1955, Serial No. 501,059

3 Claims. (Cl. 250—36)

This invention relates to blocking oscillator circuits and in particular to circuits of this type which utilize semiconductor devices such as transistors as the active signal amplifying element thereof.

In blocking oscillator circuits, oscillation is sustained for a predetermined time after which oscillation ceases. This cycle then repeats. Such a circuit is useful as a pulse generator, for example.

In a blocking oscillator circuit utilizing a transistor, the feedback necessary for oscillation is provided between the collector and base electrodes by means of a transformer. An RC time constant network is connected with the base. The capacitor of the time constant network charges up to bias the base in such a direction that the forward bias between the emitter and base electrodes is reduced and the transistor is cut-off. The capacitor then discharges to the point where the transistor is conductive and oscillation begins. Since the emitter current of the transistor is not controlled between pulses, the current drain of such a circuit is determined by the product of the current $I_{co}$, which is the leakage saturation current from the collector-to-base of the transistor, and the current gain of the transistor.

It is an object of the present invention to provide an improved transistor blocking oscillator circuit in which current and power drain are minimized.

It is another object of the present invention to provide an improved blocking oscillator circuit utilizing a transistor as the active amplifying element which is efficient, stable and reliable in operation.

These and further objects and advantages of the present invention are achieved, in general, by a blocking oscillator circuit arrangement utilizing a transistor wherein feedback is provided between the collector and base electrodes of the transistor by means of a transformer. To minimize current and power drain in accordance with the invention, the RC time constant network for the circuit is connected with the emitter of the transistor, rather than the base. In a preferred embodiment, a diode is also connected in series with the emitter so that this electrode is effectively isolated in the periods between the generation of pulses. In addition to providing efficient circuit operation by this arrangement, the circuits embodying the invention are reliable and stable.

Figure 1:
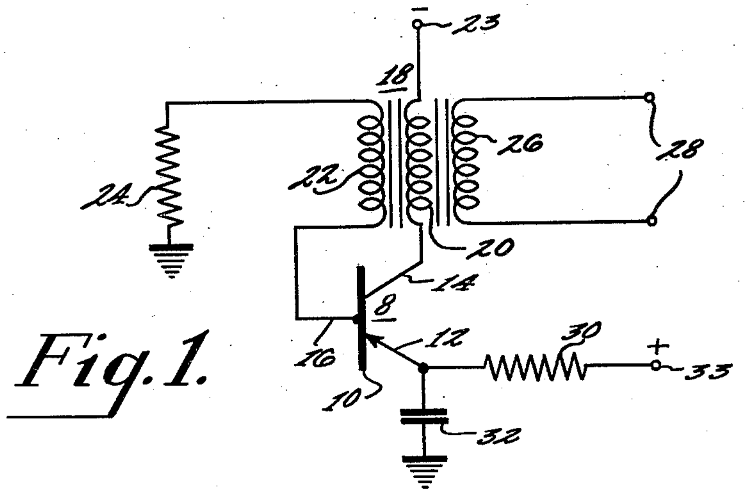
Figure 2:
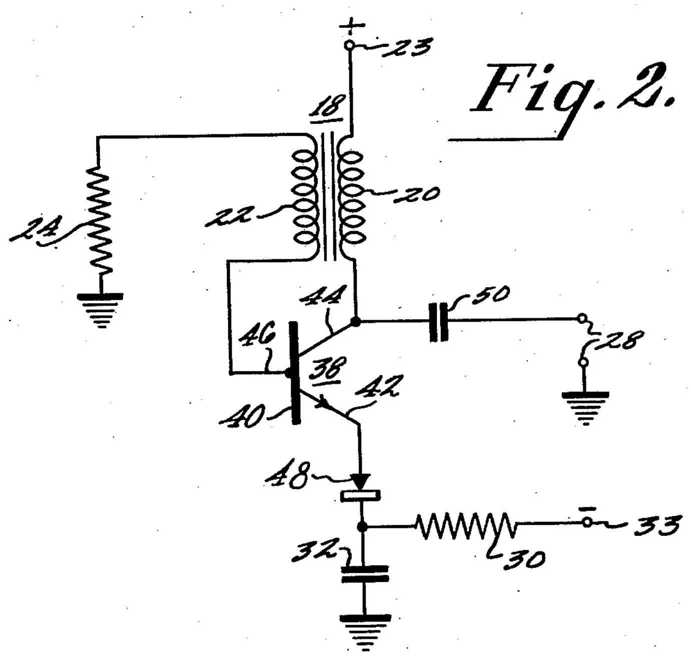

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1 and 2 are schematic circuit diagrams of blocking oscillator circuits utilizing a transistor as the active amplifying element thereof and embodying the present invention.

Referring now to the drawing, wherein like parts are indicated by like reference numerals in both figures, and referring particularly to Figure 1, a blocking oscillator circuit embodying the invention includes a transistor 8 having a semi-conductive body 10 with which an emitter 12, a collector 14 and a base 16 are cooperatively associated in a well known manner. The transistor 8 may be considered to be a P-N-P junction transistor, although it should be understood that other type transistors having characteristics similar to those of junction transistors could also be used. To provide regenerative feedback for the blocking oscillator circuit, a transformer 18 is provided which has a primary winding 20 and a secondary winding 22. The primary winding 20 of the feedback transformer 18 is serially connected between the collector and a terminal 23, which may be connected to any suitable source of negative direct current biasing potential (not shown). The secondary winding 22 of the transformer 18 is serially connected between the base 16 and a resistor 24, the other end of which is connected to a point of reference potential or ground for the system.

Output pulses may be derived from a pair of output terminals 28 which are connected to either end of a winding 26 which is coupled with the primary winding 20 of the feedback transformer 18. In accordance with the invention, the RC time constant network for the oscillator circuit is connected with the emitter electrode 12 of the transistor 8. To this end, the emitter 12 is connected through a capacitor 32 of the time constant network to ground and through a resistor 30 of the time constant network to a terminal 33 which may be connected to one terminal of a suitable source of positive biasing voltage (not shown). By this expedient, efficient as well as stable circuit operation is achieved.

In operation, assume that the capacitor 32 is initially in a discharged condition. Under these circumstances, the emitter 12 is biased in the forward direction and emitter current will flow in the forward or current conducting direction, that is, into the semi-conductive body for a transistor of N type conductivity. By means of the transformer coupling between the collector 14 and the base 16, regenerative action begins and the transistor 8 begins to conduct. This condition continues until the capacitor 32 charges sufficiently to reduce the forward bias between the emitter 12 and the base 16 sufficiently to render the transistor 8 non-conductive. Thus, through the regenerative feedback provided between the collector and base, oscillation is sustained for a period of time determined by the circuit constants.

When the capacitor 32 charges sufficiently, however, to render the transistor 8 non-conductive and thus preventing the regenerative action described, the current drain of the circuit is held to the current $I_{co}$ which flows through the base resistor 24 to ground. Accordingly, the efficiency of the circuit is high, while circuit reliability is not affected. Moreover, since the emitter 12 is biased with a constant current source, circuit stability is insured. Thus, by provision of the invention, highly efficient, reliable and stable circuit operation is provided.

The regenerative action described and thus oscillation commences again when the capacitor 32 discharges through the emitter resistor 30. The cycle then repeats. A useful pulse of voltage is thus available at the collector at predetermined intervals and may be derived from the output terminal 28.

In Figure 2, a blocking oscillator circuit of the same general type as the one illustrated in Figure 1 includes a transistor 38 which may be considered to be an N-P-N junction transistor. The transistor 30 includes a semi-conductive body 40 with which an emitter 42, a collector 44 and a base 46 are cooperatively associated. To properly bias the transistor 38, which in this case is of P type conductivity, the collector biasing terminal 23 will normally be connected to a source of positive direct current biasing potential. The emitter 42 of the transistor 38, on the other hand, is connected through a diode 48, which is preferably constructed of silicon, and the emitter resistor 30 to the terminal 33 which in this case is preferably connected to a negative source of direct current potential. Another difference in the circuit of Figure 2 is that the output pulses are capacitively coupled from the collector through a coupling capacitor 50 to one output terminal 28, the other of which is grounded.

By utilizing a diode as described in series with the emitter of the transistor, the emitter is more effectively isolated from the circuit operation in the period between pulses. This insures that the current drain will be held to the current $I_{co}$ in the period between pulses. Thus a circuit of the type illustrated in Figure 2 is capable of providing output pulses at maximum efficiency.

In operation, the circuit illustrated in Figure 2 is substantially identical to the circuit illustrated in Figure 1 except that the polarity of the various voltages are, of course, reversed. Oscillation begins when the capacitor 32 discharges through the resistor 30 sufficiently to permit conduction of current in the forward direction through the diode 48 and the emitter electrode 42 of the transistor 38. It is obvious that a diode could also be used in series with the emitter, although oppositely poled, if a transistor of N type conductivity were utilized.

As described herein, an improved transistor blocking oscillator circuit is seen to be capable of providing useful voltage pulses of predetermined width and repetition rate. These pulses are provided, moreover, in accordance with the invention, by a circuit which combines the advantages of efficiency, stability and reliability.

What is claimed is:

1. In a blocking oscillator circuit the combination with a transistor having base, emitter and collector electrodes, of means providing regenerative feedback between said collector and base electrodes including a transformer having a primary and a secondary winding, means connecting said primary winding with said collector electrode, means serially connecting said secondary winding between said base electrode and a point of reference potential, a diode connected with said emitter electrode, a time constant network for said circuit including a resistor and a capacitor, means connecting said resistor in series with said diode, said capacitor being connected between the junction of said resistor and said diode and said point of reference potential, means providing a source of biasing potential serially connected with said resistor and with said primary winding, and means providing an output circuit coupled with said collector electrode.

2. A blocking oscillator circuit comprising, in combination, a transistor having base, emitter and collector electrodes, means providing regenerative feedback between said collector and base electrodes, a unilateral conducting device serially connected with said emitter electrode, and a time constant network for said circuit connected with said unilateral conducting device.

3. In a blocking oscillator circuit the combination comprising, a junction transistor having a current gain of less than unity as defined by the ratio of collector current increments to emitter current increments, means providing regenerative feedback between said collector and base electrodes including a transformer having a primary and a secondary winding, means connecting said primary winding with said collector electrode, a resistance-capacitance time-constant network connected with said emitter electrode, means providing a source of biasing potential connected between said collector and emitter electrodes for biasing said collector electrode in the reverse direction relative to said base electrode and said emitter electrode in the forward direction relative to said base electrode, and means including said secondary winding connecting said base electrode with a point of reference potential in said oscillator circuit.

References Cited in the file of this patent

UNITED STATES PATENTS 2,211,852 Geiger ---------------- Aug. 20, 1940

OTHER REFERENCES

"A transistor blocking oscillator," page 687–98 of, "The Transistor," published by Bell Labs., Dec. 4, 1951.

Article: "Junction-Transistor Equivalent Circuits," by Giacoletto, from PIRE for November 1952, vol. 40, No. 11, pages 1490–1493.

Article: "Junction-transistor circuit applications," by Sulzer; pages 170–173 of "Electronics" for August 1953.

Notice of Adverse Decision in Interference

In Interference No. 90,040 involving Patent No. 2,816,230, J. E. Lindsay, Blocking oscillator circuit, final judgment adverse to the patentee was rendered Sept. 7, 1962, as to claim 2.

[*Official Gazette February 5, 1963.*]